(12) United States Patent
Hwang

(10) Patent No.: US 7,572,690 B2
(45) Date of Patent: Aug. 11, 2009

(54) METHOD OF FABRICATING CMOS THIN FILM TRANSISTOR (TFT) AND CMOS TFT FABRICATED USING THE SAME

(75) Inventor: Eui-Hoon Hwang, Suwon-si (KR)

(73) Assignee: Samsung Mobile Display Co., Ltd., Yongin, Gyunggi-Do (KR)

( * ) Notice: Subject to any disclaimer, the term of this patent is extended or adjusted under 35 U.S.C. 154(b) by 0 days.

(21) Appl. No.: 11/155,781

(22) Filed: Jun. 20, 2005

(65) Prior Publication Data

US 2006/0006469 A1    Jan. 12, 2006

(30) Foreign Application Priority Data

Jun. 30, 2004    (KR) .................. 10-2004-0050918

(51) Int. Cl.
   *H01L 29/72* (2006.01)
(52) U.S. Cl. ............ 438/197; 438/199; 438/275; 257/351
(58) Field of Classification Search ......... 438/197, 438/199, 275; 257/351
   See application file for complete search history.

(56) References Cited

U.S. PATENT DOCUMENTS

| 6,429,485 | B1 * | 8/2002 | Ha et al. ............ 257/351 |
| 6,635,521 | B2 | 10/2003 | Zhang et al. |
| 6,677,107 | B1 * | 1/2004 | Hasegawa et al. ........ 430/311 |
| 6,933,188 | B1 * | 8/2005 | Verma et al. ............ 438/197 |
| 2003/0025127 | A1 | 2/2003 | Yanai et al. |
| 2005/0253149 | A1 * | 11/2005 | Yamazaki et al. ........... 257/72 |

FOREIGN PATENT DOCUMENTS

| JP | 06-059279 | 3/1994 |
| JP | 6-59279 | 3/1994 |
| JP | 2003-045892 | 2/2003 |

OTHER PUBLICATIONS

Chinese Office Action for corresponding Chinese Patent Application No. 200510082118.4, issued on Sep. 29, 2006.
Chinese Certificate of Patent issued on Nov. 26, 2008 in corresponding Chinese Patent Application No. 200510082118.4.
Korean Office Action of the Korean Patent Application No. 2004-50918, issued on Apr. 28, 2006.

* cited by examiner

*Primary Examiner*—Edward Wojciechowicz
(74) *Attorney, Agent, or Firm*—Robert E. Bushnell, Esq.

(57) ABSTRACT

A method of fabricating a CMOS thin film transistor (TFT) and a CMOS TFT fabricated using the method involve provision of a substrate having a first region and a second region. A first semiconductor layer and a second semiconductor layer are formed on the first and second regions, respectively. A gate insulating layer having a first portion overlying end portions of the first semiconductor layer, and a second portion overlying end portions of the second semiconductor layer and having a thickness larger than that of the first portion, is formed on the semiconductor layers. An ion doping mask pattern is formed on the gate insulating layer. First impurities are doped in end portions of the first semiconductor layer using the ion doping mask pattern as a mask, and second impurities having a conductivity type different from that of the first impurities are doped in end portions of the second semiconductor layer. As a result, it is possible to reduce the number of masks, and to simplify the processes required for manufacture of the CMOS TFT.

25 Claims, 10 Drawing Sheets

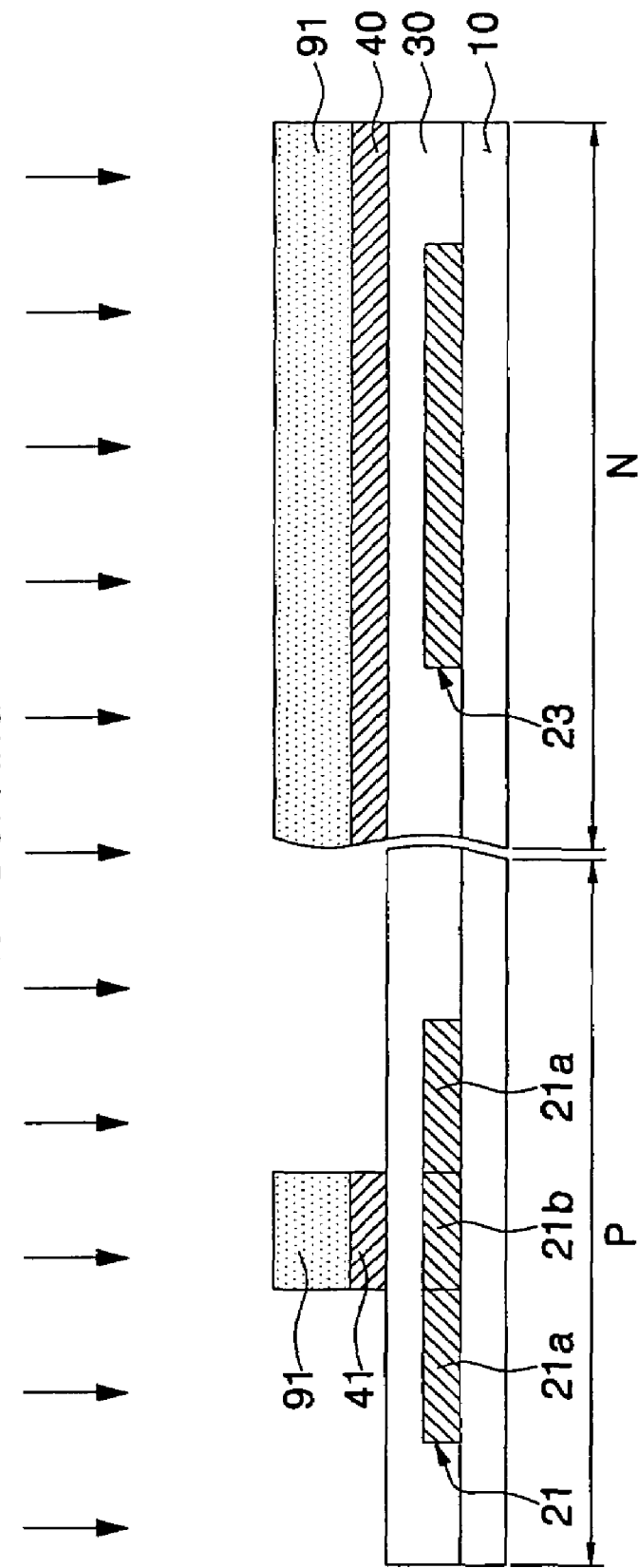

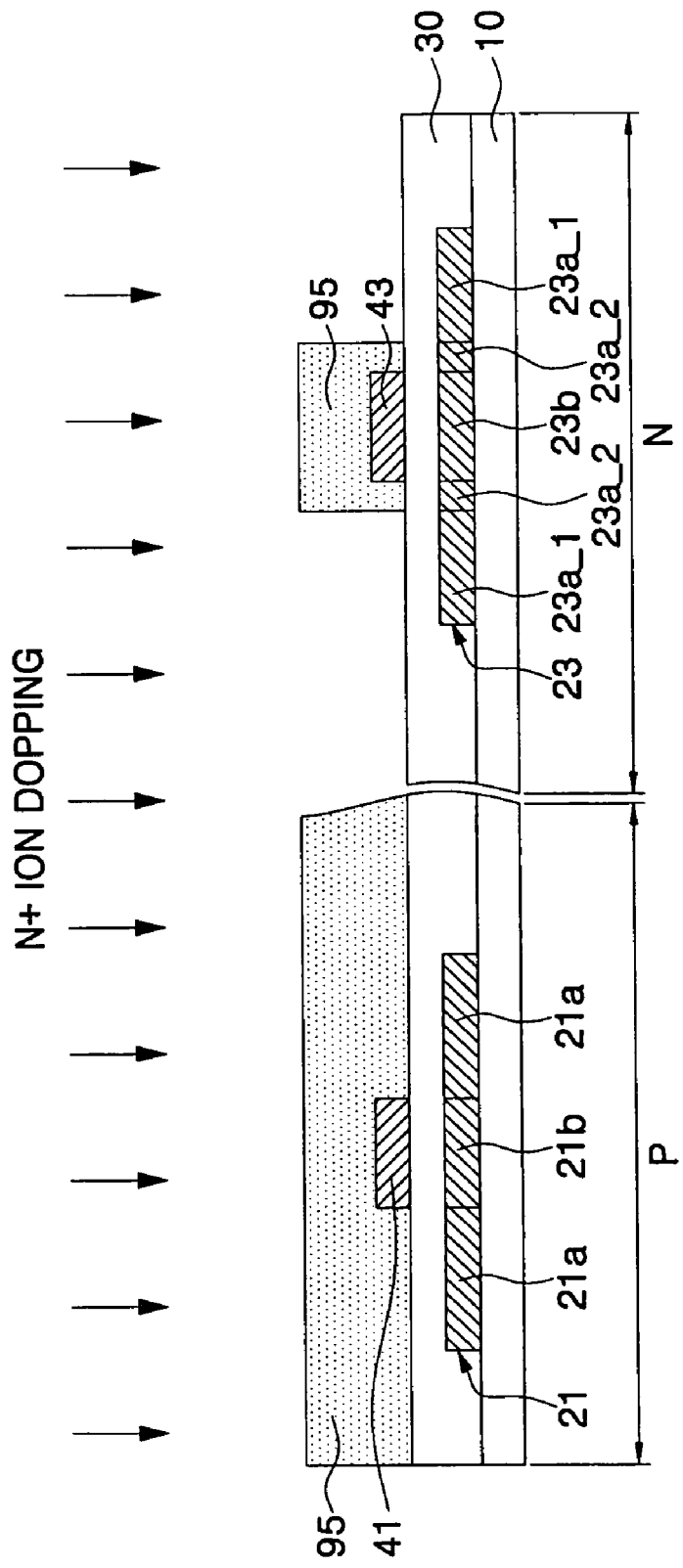

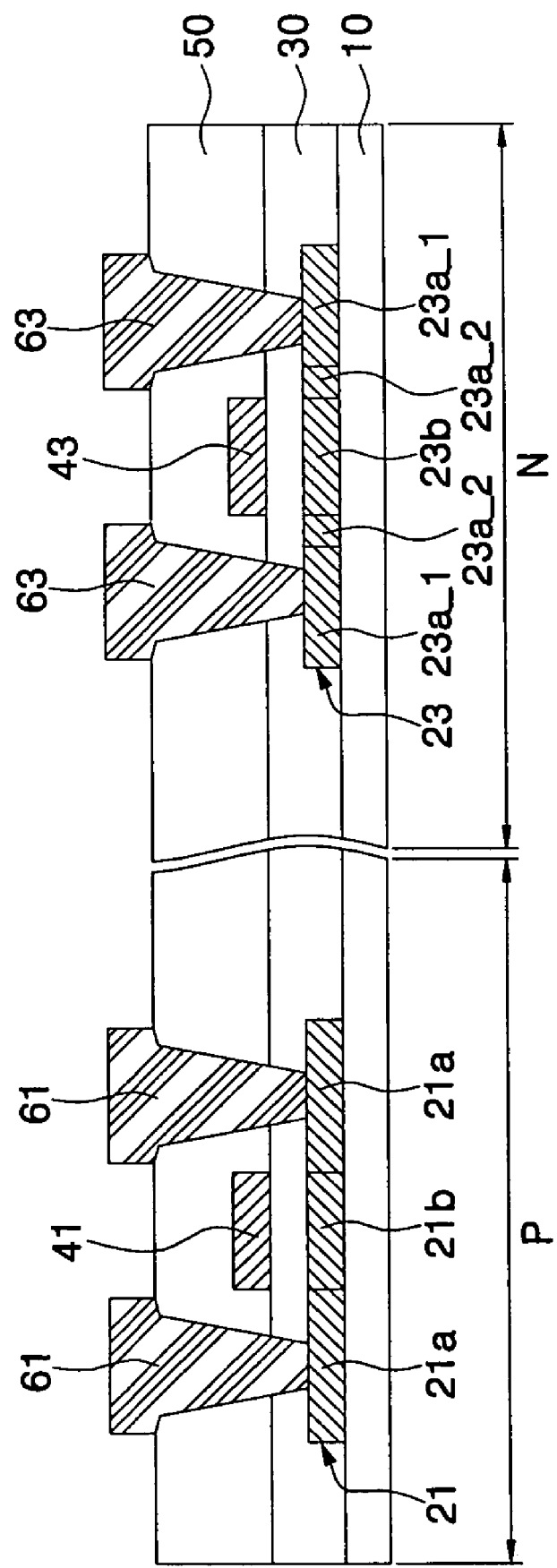

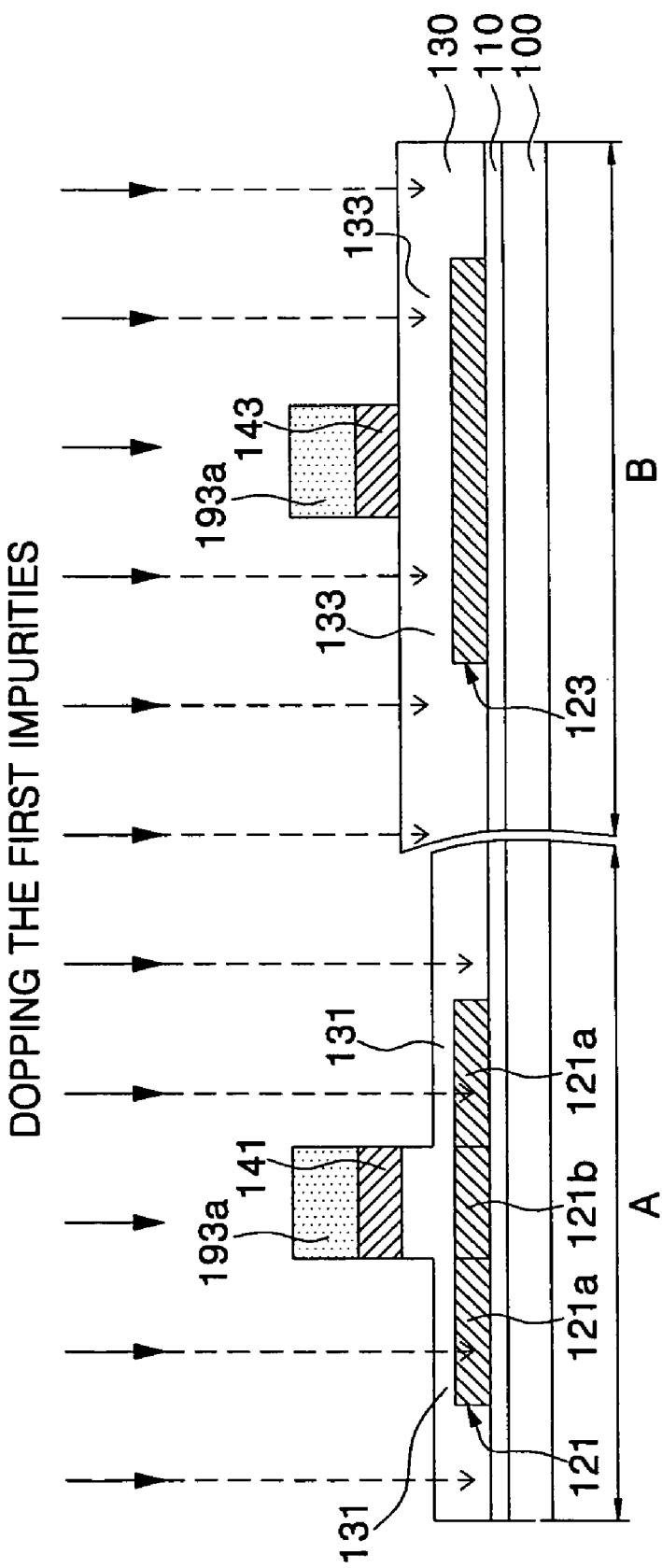

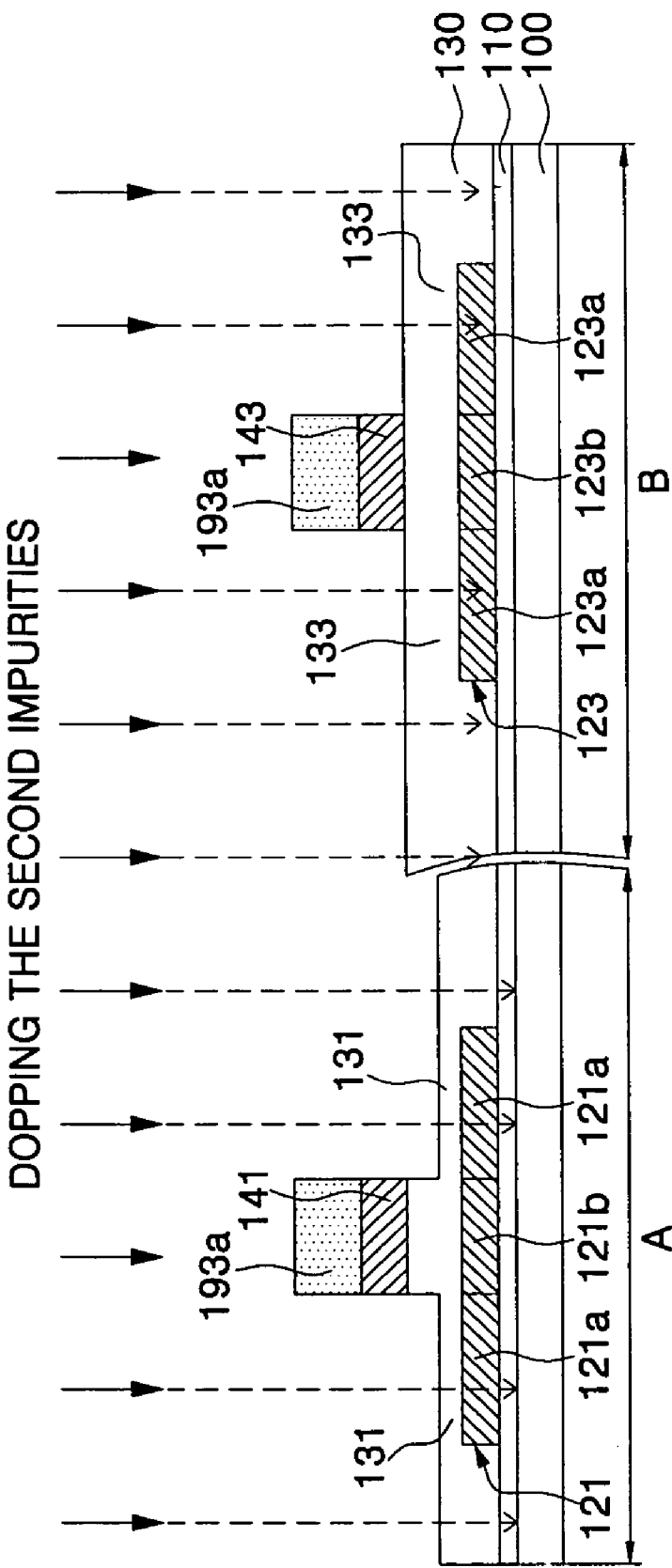

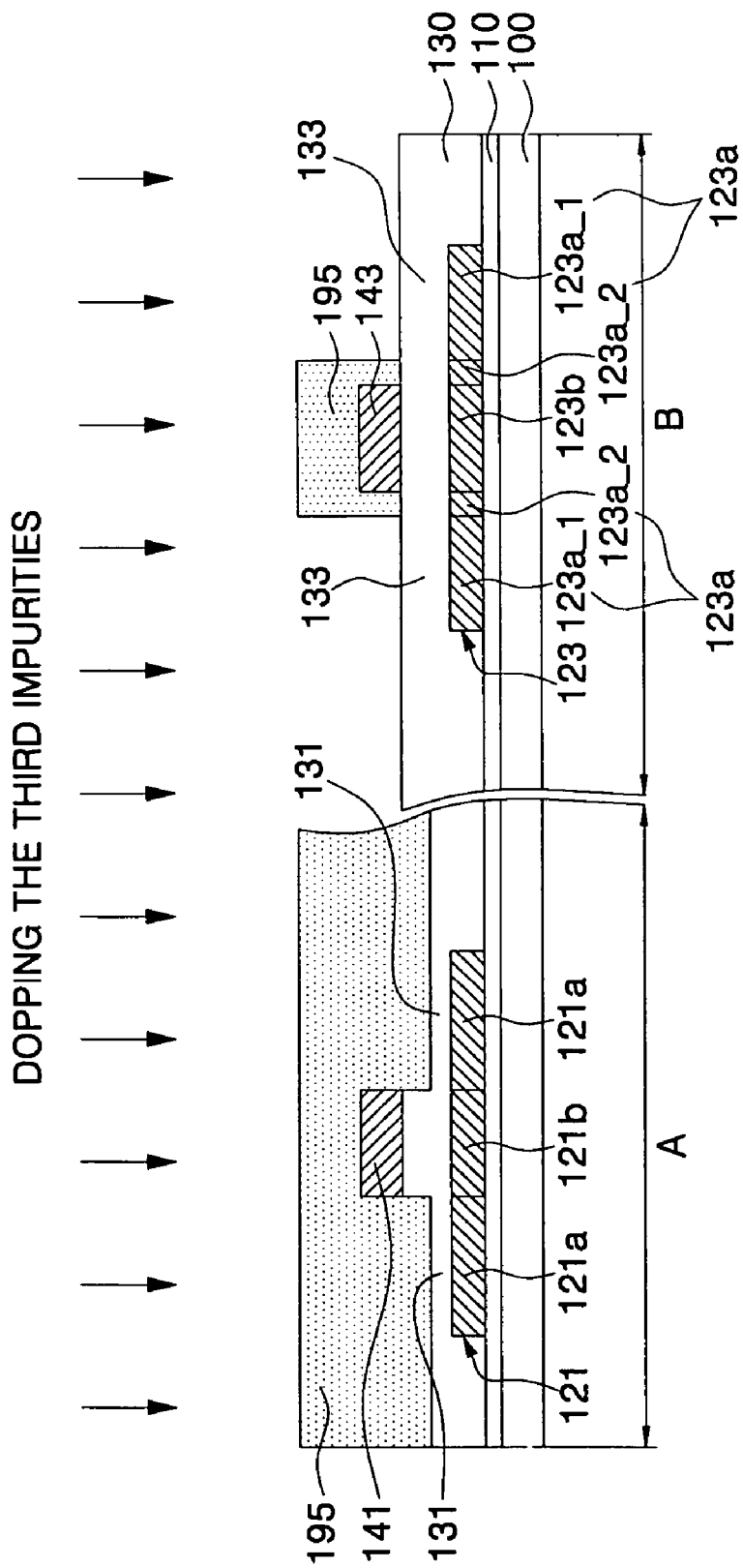

METHOD OF FABRICATING CMOS THIN FILM TRANSISTOR (TFT) AND CMOS TFT FABRICATED USING THE SAME

CLAIM OF PRIORITY

This application makes reference to, incorporates the same herein, and claims all benefits accruing under 35 U.S.C. §119 from an application for METHOD OF FABRICATING CMOS TFT AND CMOS TFT FABRICATED USING THE SAME earlier filed in the Korean Intellectual Property Office on Jun. 30, 2004 and there duly assigned Serial No. 10-2004-50918.

BACKGROUND OF THE INVENTION

1. Technical Field

The present invention relates to a thin film transistor (TFT) and, more particularly, to a method of fabricating a CMOS TFT, and a CMOS TFT fabricated using the method.

2. Related Art

A CMOS thin film transistor (TFT) is a device having a PMOS TFT and an NMOS TFT, and has the advantage of being capable of implementing various circuits and systems which are difficult to be implemented using only the NMOS TFT or the PMOS TFT.

In a method of fabricating a CMOS TFT, a substrate including a PMOS region and an NMOS region is provided, and then, a PMOS semiconductor layer and an NMOS semiconductor layer are formed on the PMOS region and the NMOS region using a first mask. A gate insulating layer is formed on the semiconductor layers. A gate conductive layer is deposited on the gate insulating layer, a photoresist pattern is formed on the gate conductive layer using a second mask, and the gate conductive layer is etched using the photoresist pattern as a mask, thereby forming a PMOS gate electrode overlying the PMOS semiconductor layer. At this point, a gate conductive layer shielded by the photoresist pattern remains in the NMOS region. Subsequently, by doping with P-type impurities in high concentration using the photoresist pattern and the PMOS gate electrode as masks, source and drain regions are formed in the PMOS semiconductor layer, and a channel region is defined between the source and drain regions.

The photoresist pattern is removed, and a new photoresist pattern is formed using a third mask. The gate conductive layer is etched to form an NMOS gate electrode overlying the NMOS semiconductor layer using the photoresist pattern as a mask. Next, by doping with N-type impurities in low concentration using the photoresist pattern and the NMOS gate electrode as masks, low concentration impurity regions are formed in the NMOS semiconductor layer, and a channel region is defined between the low concentration impurity regions.

The photoresist pattern is removed to form a photoresist pattern using a fourth mask. By doping with N-type impurities in high concentration using the photoresist pattern as a mask, high concentration impurity regions are formed in the NMOS semiconductor layer, and low concentration impurity regions remain at one side of the high concentration impurity regions to form a lightly doped drain (LDD) region.

The photoresist pattern is removed to expose the gate electrodes. An interlayer-insulating layer is formed on the exposed gate electrodes, and contact holes exposing portions of source and drain regions of the PMOS semiconductor layer and portions of the high concentration impurity region of the NMOS semiconductor layers are formed in the interlayer-insulating layer using a fifth mask. Subsequently, PMOS source and drain electrodes and NMOS source and drain electrodes respectively in contact with the exposed regions by the contact holes of the semiconductor layers through the contact holes are formed using a sixth mask.

In order to implement the CMOS TFT as described above, since both the PMOS TFT and the NMOS TFT have to be formed on one substrate, relatively many processes are required. In particular, as the LDD region is formed, in order to decrease leakage current and to solve a reliability problem, such as a hot carrier effect based on a scale-down of the NMOS TFT, the number of masks for implementing the CMOS TFT have to be increased. Therefore, as described above, the CMOS TFT including the NMOS TFT having the LDD region requires at least six masks.

SUMMARY OF THE INVENTION

The present invention solves the aforementioned problems associated with the described devices by providing a method of fabricating a CMOS thin film transistor (TFT) and a CMOS TFT fabricated using the method, wherein the number of masks required to make the CMOS TFT is decreased, and the processes are simplified.

In an exemplary embodiment of the present invention, a method of fabricating a CMOS TFT includes providing a substrate having a first region and a second region. A first semiconductor layer and a second semiconductor layer are formed on the first and second regions, respectively. A gate insulating layer is formed so as to have a first portion overlying first source and drain regions of the first semiconductor layer and a second portion overlying second source and drain regions of the second semiconductor layer, wherein the second portion is thicker than the first portion. An ion doping mask pattern is formed on the gate insulating layer. First impurities are doped in the first source and drain regions of the first semiconductor layer using the ion doping mask pattern as a mask, and second impurities having a conductivity type different from the first impurities are doped in the second source and drain regions of the second semiconductor layer using the ion doping mask pattern as a mask.

A difference in thickness between the first and second portions of the gate insulating layer is at least 500 Å, preferably 500 to 1500 Å. The first portion of the gate insulating layer has a thickness of 1000 Å or less. The second portion of the gate insulating layer has a thickness of 500 to 1500 Å.

Preferably, an acceleration voltage for doping the second impurities is higher than that for doping the first impurities. Furthermore, the difference between the acceleration voltages for doping the first and second impurities is about 30 to about 100 KeV. The first impurities are doped at an acceleration voltage of about 10 to about 80 KeV, and the second impurities are doped at an acceleration voltage of about 40 to about 110 KeV.

The first impurities are P-type impurities, which are doped in high concentration. In this case, the second impurities are N-type impurities, which are doped in low concentration. On the contrary, the first impurities may be N-type impurities, which are doped in low concentration. In this case, the second impurities are P-type impurities, which are doped in high concentration.

In the method, after doping the first impurities at the first source and drain regions of the first semiconductor layer, the second impurities are doped at the second source and drain regions of the second semiconductor layer. Alternatively, after doping the second impurities at the end portions of the second semiconductor layer, the first impurities are doped at the first source and drain regions of the first semiconductor layer.

Preferably, the gate insulating layer having the first and second portions, and the ion doping mask pattern, are formed using a single halftone photo-mask. In addition, the ion mask pattern preferably comprises first and second gate electrodes overlying the first and second semiconductor layers, respectively.

In another exemplary embodiment of the present invention, a CMOS TFT includes a substrate having a first region and a second region. A first semiconductor layer and a second semiconductor layer are located on the first and second regions, respectively. A gate insulating layer is formed so as to have a first portion overlying first source and drain regions of the first semiconductor layer and a second portion overlying second source and drain regions of the second semiconductor layer, wherein the second portion is thicker than the first portion. A first gate electrode overlying the first semiconductor layer and a second gate electrode overlying the second semiconductor layer are located on the gate insulating layer.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIGS. 1A, 1B, 1C and 1D are cross-sectional views illustrating a method of fabricating a CMOS thin film transistor (TFT) based on each process; and FIGS. 2A, 2B, 2C, 2D, 2E, and 2F are cross-sectional views illustrating a method of fabricating a CMOS TFT based on each process in accordance with an embodiment of the present invention.

DETAILED DESCRIPTION OF THE INVENTION

Figure 1B:
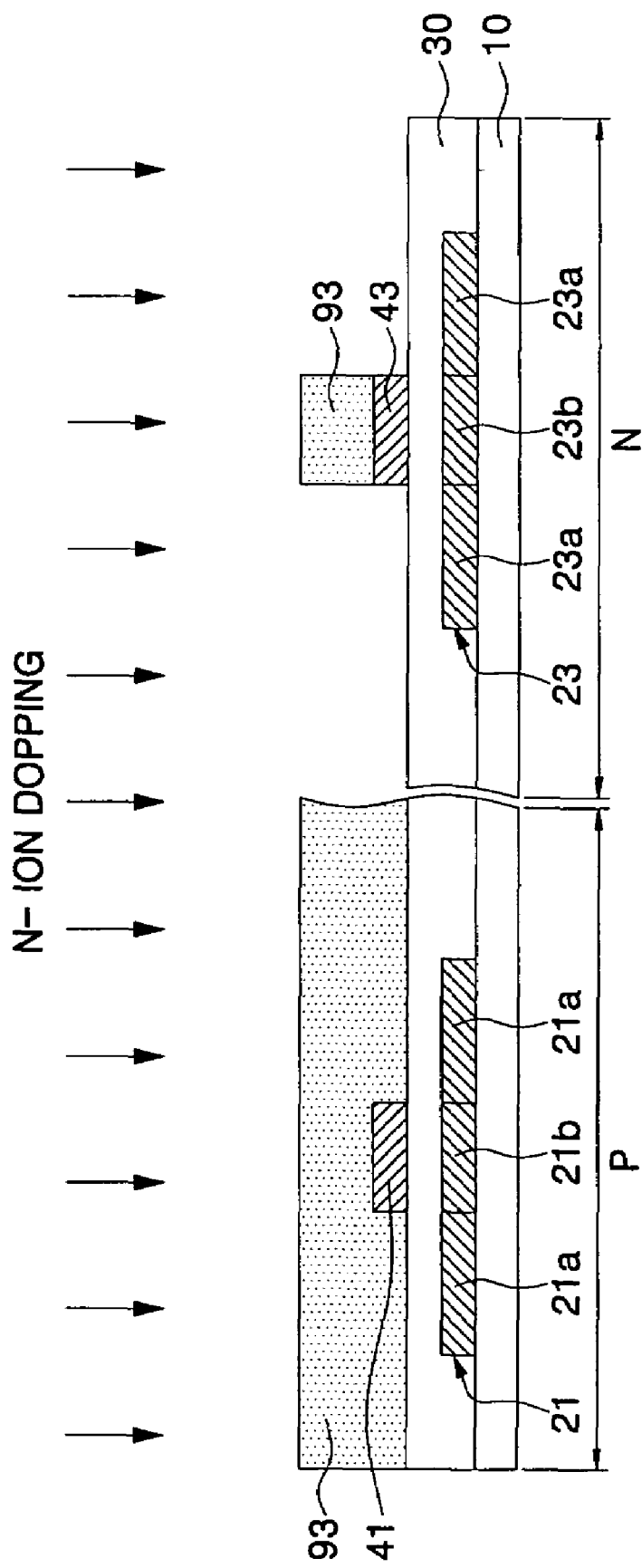

Reference will now be made in detail to the embodiments of the present invention, examples of which are illustrated in the accompanying drawings, wherein like reference numerals refer to the like elements throughout. The embodiments of the invention are described below with reference to the various figures.

FIGS. 1A, 1B, 1C and 1D are cross-sectional views illustrating a method of fabricating a CMOS thin film transistor (TFT) based on each process.

Referring to FIG. 1A, a substrate 10 including a PMOS region P and an NMOS region N is provided, and then, a PMOS semiconductor layer 21 and an NMOS semiconductor layer 23 are formed in the PMOS region P and the NMOS region N, respectively, using a first mask. A gate insulating layer 30 is formed on the semiconductor layers 21 and 23, respectively. A gate conductive layer 40 is deposited on the gate insulating layer 30, a photoresist pattern 91 is formed on the gate conductive layer 40 using a second mask, and the gate conductive layer 40 is etched using the photoresist pattern 91 as a mask, thereby forming a PMOS gate electrode 41 overlying the PMOS semiconductor layer 21. At this point, a gate conductive layer 40 shielded by the photoresist pattern 91 remains in the NMOS region N. Subsequently, by doping with P-type impurities in high concentration using the photoresist pattern 91 and the PMOS gate electrode 41 as masks, source and drain regions 21a are formed in the PMOS semiconductor layer 21, and a channel region 21b is defined between the source and drain regions 21a.

Referring to FIG. 1B, the photoresist pattern 91 of FIG. 1A is removed, and a new photoresist pattern 93 is formed using a third mask. The gate conductive layer 40 of FIG. 1A is etched to form an NMOS gate electrode 43 overlying the NMOS semiconductor layer 23 using the photoresist pattern 93 as a mask. Next, by doping with N-type impurities in low concentration using the photoresist pattern 93 and the NMOS gate electrode 43 as masks, low concentration impurity regions 23a are formed in the NMOS semiconductor layer 23. At this point, a channel region 23b is defined between the low concentration impurity regions 23a.

Referring to FIG. 1C, the photoresist pattern 93 of FIG. 1B is removed to form a photoresist pattern 95 using a fourth mask. By doping with N-type impurities in high concentration using the photoresist pattern 95 as a mask, high concentration impurity regions 23a_1 are formed in the NMOS semiconductor layer 23. At this point, low concentration impurity regions 23a_2 remain at respective sides of the high concentration impurity regions 23a_1 so as to form a lightly doped drain (LDD) region.

Referring to FIG. 1D, the photoresist pattern 95 of FIG. 1C is removed to expose the gate electrodes 41 and 43. An interlayer-insulating layer 50 is formed on the exposed gate electrodes 41 and 43, and contact holes exposing portions of the source and drain regions 21a of the semiconductor layers 21 and portions of the high concentration impurity regions 23a-1 of the semiconductor layer 23 are formed in the interlayer-insulating layer 50 using a fifth mask. Subsequently, PMOS source and drain electrodes 61 and NMOS source and drain electrodes 63 in contact with the exposed regions by the contact holes of the semiconductor layers 21 and 23, respectively, through the contact holes are formed using a sixth mask.

FIGS. 2A, 2B, 2C, 2D, 2E, and 2F are cross-sectional views illustrating a method of fabricating a CMOS TFT based on each process in accordance with an embodiment of the present invention.

Figure 2A:
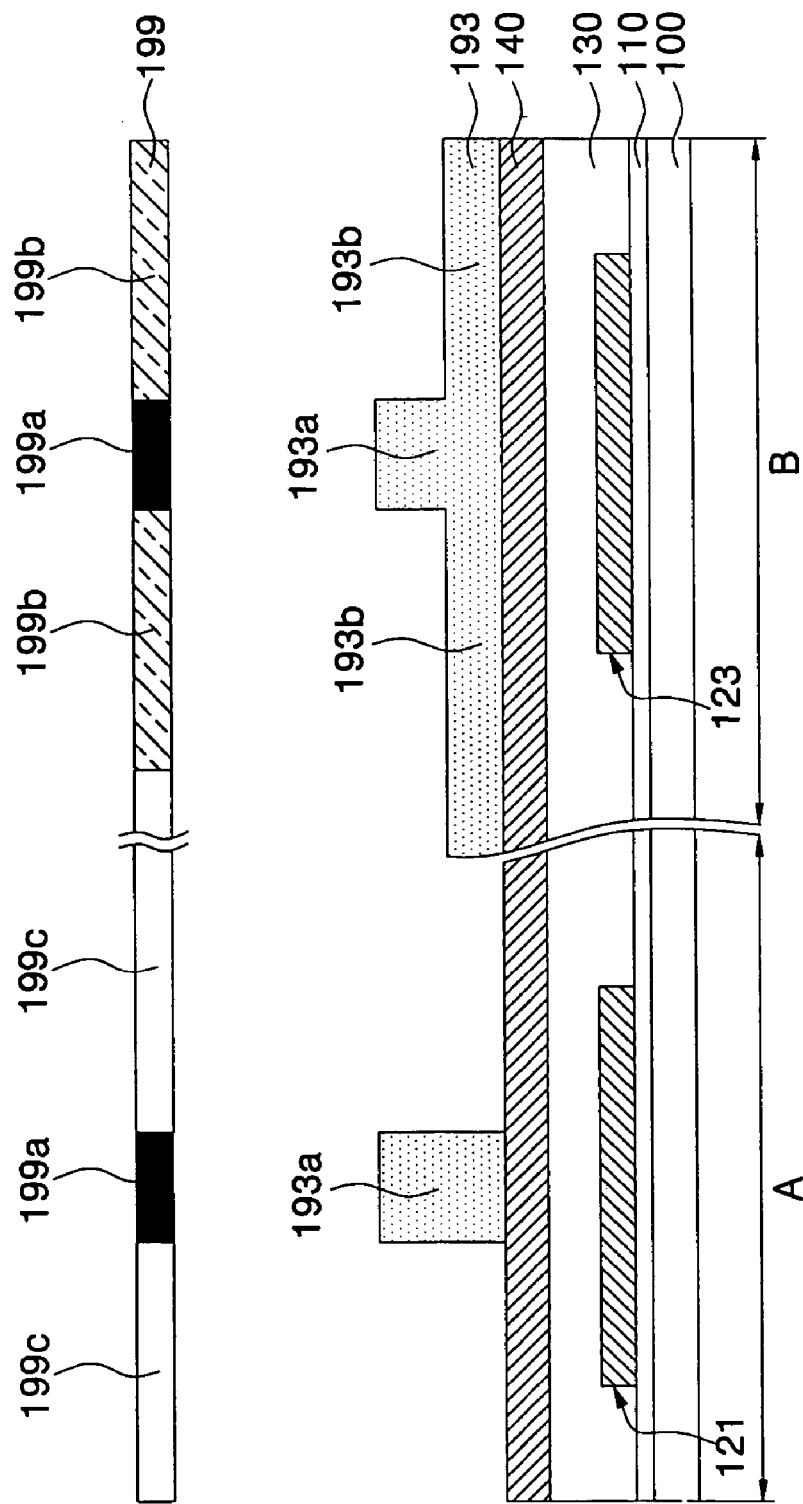

Referring to FIG. 2A, a substrate 100 including a first region A and a second region B is provided. Any one of the first region A and second region B is an NMOS region, and the other is a PMOS region. The substrate 100 is a single crystal silicon, glass, quartz or plastic substrate.

A buffer layer 110 is formed on the substrate 100. The buffer layer 110 is a silicon oxide layer, a silicon nitride layer, a silicon oxynitride layer, or a stacked-layer thereof.

A first semiconductor layer 121 and a second semiconductor layer 123 are formed on the buffer layer 110 using a first pattern mask. The pattern mask for forming a pattern on the substrate is referred to as a photo-mask, a shadow mask, and the like. An example of a method of fabricating the semiconductor layers 121 and 123 is described as follows. An amorphous silicon layer is deposited on the buffer layer 110, and the amorphous silicon layer is crystallized by a solid phase crystallization (SPC) method, an excimer laser annealing (ELA) method, a sequential lateral solidification (SLS) method, or a metal induced crystallization (MIC) method, thereby forming a polycrystalline silicon layer. A photoresist layer is formed on the polycrystalline silicon layer, and the photoresist layer is exposed and developed using the first pattern mask, i.e., first photo-mask to form a photoresist pattern. The polycrystalline silicon layer is etched using the photoresist pattern as a mask. As a result, the first semiconductor layer 121 is formed on the first region A, and the second semiconductor layer 123 is formed on the second region B.

A gate insulating layer 130 is formed on the semiconductor layers 121 and 123. The gate insulating layer 130 is a silicon oxide layer, a silicon nitride layer or a silicon oxynitride layer. In addition, the gate insulating layer 130 is formed so as to have a thickness of approximately 500 to 1500 Å in consideration of the dielectric strength of the gate insulating layer, the threshold voltage of the TFT, and charge mobility properties.

A gate conductive layer 140 is formed on the gate insulating layer 130. A photoresist layer is formed on the gate conductive layer 140, and the photoresist layer is exposed and developed using a second pattern mask, i.e., a halftone mask 199, so as to form a photoresist pattern 193. The halftone mask 199 is a photo-mask capable of adjusting an amount of light transmitted therethrough in at least three steps, the mask 199 being provided with light-shielding portions 199a corresponding to centers of the semiconductor layers 121 and 123, halftone portions 199b corresponding to end portions of the second semiconductor layer 123 and partially transmitting light therethrough, and light-transmitting portions 199c corresponding to end portions of the first semiconductor layer 121. The centers of the semiconductor layers 121 and 123 are regions which will be formed as channel region of the semiconductor layers 121 and 123 and the end portions of the semiconductor layers 121 and 123 are regions which will be formed as source and drain regions of the semiconductor layer 121 and 123. The photoresist pattern 193 has thick portions 193a corresponding to the light-shielding portions 199a and thin portions 193b corresponding to the halftone portions 199b, and the gate conductive layer 140 on the end portions of the first semiconductor layer 121 is exposed by the photoresist pattern 193 at portions corresponding to the light-transmitting portions 199c. Therefore, the thick portions 193a are formed to correspond to the centers of the semiconductor layers 121 and 123, and the thin portions 193b are formed to correspond to the end portions of the second semiconductor layer 123.

Figure 2B:
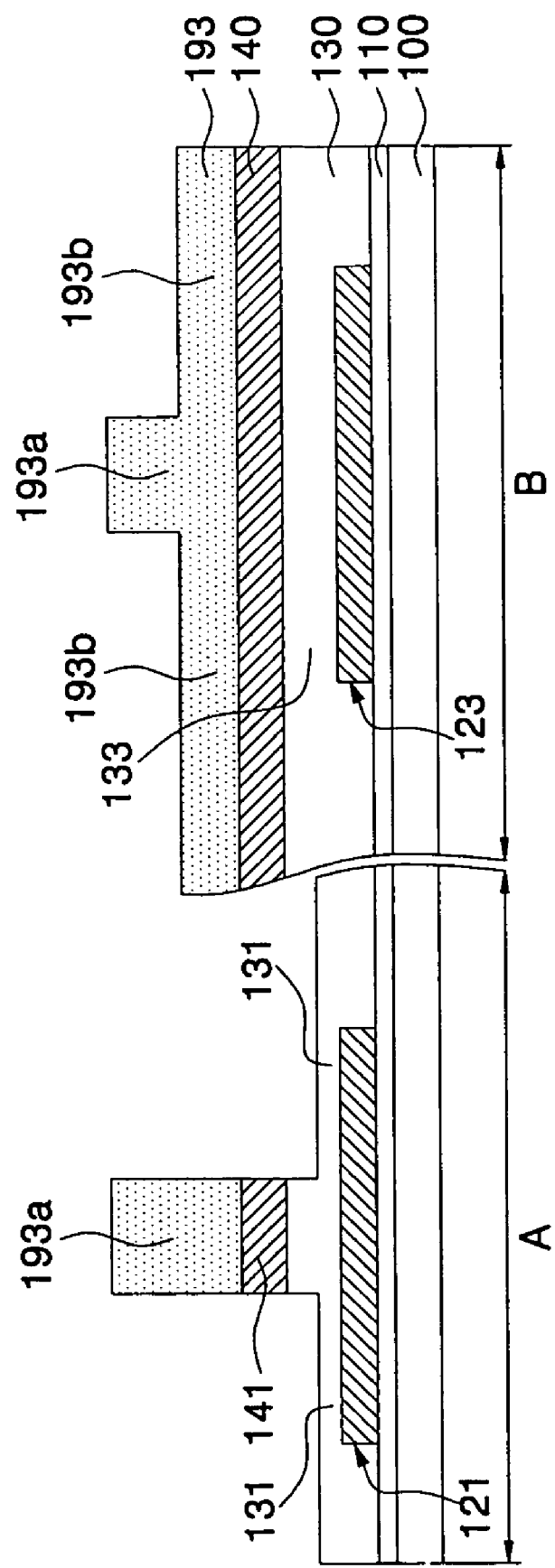

Referring to FIG. 2B, the gate conductive layer 140 of FIG. 2A is etched using the photoresist pattern 193 as a mask to form a first gate electrode 141 overlying the center of the first semiconductor layer 121. Etching of the gate conductive layer may be performed by means of a wet etching method or a dry etching method. The gate insulating layer 130 is etched using the photoresist pattern 193 and the first gate electrode 141 as masks so as to form a first portion 131 overlying the end portions of the first semiconductor layer 121. Etching of the gate insulating layer 130 may be performed by a dry etching method. The first portion 131 has a thickness of 1000 Å or less. Furthermore, the first portion 131 is an opening exposing the end portions of the first semiconductor layer 121.

The gate insulating layer 130 overlies the end portions of the second semiconductor layer 123, and has a second portion 133 thicker than the first portion 131. Eventually, the gate insulating layer 130 is formed, and has the first portion 131 overlying the end portions of the first semiconductor layer 121 and the second portion 133 overlying the end portions of the second semiconductor layer 123, wherein the second portion 133 is thicker than the first portion 131. A difference in thickness between the first portion 131 and second portion 133 is at least 500 Å, preferably 500 to 1500 Å. Furthermore, the second portion 133 has a thickness of about 500 to 1500 Å.

Referring to FIG. 2C, the thin portions 193b of FIG. 2B of the photoresist pattern are etched so as to expose the gate conductive layer 140 on the end portions of the second semiconductor layer 123. Therefore, only the thick portions 193a of the photoresist pattern remain on the first gate electrode 141 and the gate conductive layer 140 over the second region B. The thin portions of the photoresist pattern may be etched by an ashing method employing oxygen plasma. At this point, upper portions of the thick portions 193a of the photoresist pattern are partially etched.

Subsequently, the exposed gate conductive layer is etched using the thick portions 193a of the photoresist pattern as masks so as to form a second gate electrode 143 overlying the center of the second semiconductor layer 123. As a result, the second portion 133 of the gate insulating layer 130 is exposed around the second gate electrode 143. Meanwhile, the gate insulting layer under the gate electrodes 141 and 143 has a thickness substantially equal to the second portion 133.

Next, first impurities are doped at the end portions of the first semiconductor layer 121 using the gate electrodes 141 and 143 as masks so as to form first source and drain regions 121a. A channel region 121b is defined between the first source and drain regions 121a. Doping with the first impurities is performed by adjusting the acceleration voltage such that the doped first impurities mainly exist in the end portions of the first semiconductor layer 121. Preferably, it is performed at an acceleration voltage of about 10 to about 80 KeV. In this case, while the first impurities are also doped around the second gate electrode 143 of the second region B, since the second portion 133 of the gate insulating layer 130 has a thickness larger than that of the first portion 131, most of the first impurities doped around the second gate electrode 143 exist in the second portion 133. Therefore, the concentration of the first impurities doped in the second semiconductor layer 123 is much lower than that of the first impurities doped in the first semiconductor layer 121. Furthermore, when the second portion 133 is thicker than the first portion by at least 500 Å, the first impurities may be hardly doped in the second semiconductor layer 123. The reason for this is that the concentration of the doped impurities has a maximum value at Rp and a Gaussian distribution about it. At this point, ΔRp is generally not more than 500 Å.

The first impurities may be P-type impurities. The P-type impurities may be doped in high concentration. Specifically, the P-type impurities may be doped in a dose of 1E14 to 2E15 ionS/cm$^2$, preferably, 8E14 to 1E15 ionS/cm$^2$. In this case, the first source and drain regions 121a may be regions where the P-type impurities are doped in high concentration.

Referring to FIG. 2D, second impurities having a conductivity type different from the first impurities are doped in the end portions of the second semiconductor layer 123 using the second gate electrode 143 as a mask so as to form second source and drain regions 123a. A channel region 123b is defined between the second source and drain regions 123a. The acceleration voltage for doping the second impurities is adjusted so that the doped second impurities pass through the second portion 133 of the gate insulating layer so as to exist in the end portions of the second semiconductor layer 123. Therefore, the acceleration voltage for doping the second impurities is, preferably, higher than the acceleration voltage for doping the first impurities. Furthermore, the difference between the acceleration voltages for doping the second and first impurities is about 30 to 100 KeV. In addition, preferably, the second impurities are doped at an acceleration voltage of about 40 to 110 KeV. In this case, while the second impurities are also doped around the first gate electrode 141 of the first region A, since the first portion 131 of the gate insulating layer has a thickness smaller than that of the second portion 133, most of the second impurities doped around the first gate electrode 141 exist in the buffer layer 110 or the substrate 100 under the first semiconductor layer 121. Therefore, concentration of the second impurities doped in the first semiconductor layer 121 is much lower than that of the second impurities doped in the second semiconductor layer 123. Furthermore, when the second portion 133 is thicker than the first portion 131 by at least 500 Å, the second impurities may be hardly doped in the first semiconductor layer 121. The reason for this is that the concentration of the doped impurities has a maximum value at Rp and a Gaussian distribution about it. At this point, ΔRp is generally not more than 500 Å.

When the first impurities are P-type impurities, the second impurities are N-type impurities. The N-type impurities are doped in low concentration. Specifically, doping the N-type impurities in low concentration is performed by doping the N-type impurities in a dose of 1E13 to 6E13 ions/cm$^2$. As a result, the second source and drain regions 123a are regions where the N-type impurities are doped in low concentration.

In the embodiment as described above, the first and second gate electrodes 141 and 143 function as ion doping mask patterns for doping the first and second impurities. However, the ion doping mask patterns are not limited thereto, and may be patterns additionally formed on the gate insulating layer. In addition, in the embodiment as described above, the gate insulating layer 130 having the first and second portions 131 and 133, respectively, and the gate electrodes 141 and 143, respectively, i.e., the ion doping mask patterns, are formed by performing one photo process using one halftone photo mask.

Furthermore, in the embodiment as described above, after doping of the first impurities in the first semiconductor layer 121, the second impurities are doped in the second semiconductor layer 123. In contrast, after doping of the second impurities in the second semiconductor layer 123, the first impurities may be doped in the first semiconductor layer 121.

As a result, the gate insulating layer 130 having the first portion 131 and the second portion 133 is formed, wherein the second portion 133 is thicker than the first portion 131. The ion doping mask patterns are formed on the gate insulating layer 130, and then the ion doping mask patterns are used as masks for doping the first impurities and a mask for doping the second impurities, thereby simplifying the process of manufacturing CMOS TFT. In other words, it is not necessary to separately form the ion-doping mask patterns in order to form the first and second impurities. Furthermore, it is possible to reduce the number of masks for manufacturing the CMOS TFT by forming the gate insulating layer 130 having the first and second portions 131 and 133 and the gate electrodes 141 and 143, i.e., the ion doping mask patterns, by one photo process using one halftone photo-mask.

Referring to FIG. 2E, the photoresist pattern 193a of FIG. 2D is removed so as to expose the gate electrodes 141 and 143. A photoresist layer is formed on the exposed gate electrodes 141 and 143, and the photoresist layer is exposed and developed using a third pattern mask so as to form a photoresist pattern 195.

The photoresist pattern 195 covers the first region A, and partially covers the second gate electrode 143 and the second portion 133 of the exposed gate insulating layer around the second gate electrode 143. Third impurities are implanted in the second semiconductor layer 123 using the photoresist pattern 195 as a mask. Preferably, the third impurities are N-type impurities doped in high concentration. Specifically, the N-type impurities may be doped in a dose of 1E14 to 2E15 ions/cm$^2$, preferably, 8E14 to 1E15 ions/cm$^2$. As a result, the second source and drain regions 123a include regions 123a_1 where the N-type impurities are doped in high concentration, and regions 123a_2, located at respective sides of the high concentration impurity regions 123a_1, where the N-type impurities are doped in low concentration. The low concentration impurity regions 123a_2 are LDD regions. As a result, leakage current of the NMOS TFT is reduced, and hot-carrier generation is suppressed so as to improve reliability.

Conversely, it is possible to form the second source and drain regions 123a of regions where the P-type impurities are doped in high concentration, and to form the first source and drain regions 121a so as to have regions where the N-type impurities are doped in low concentration and regions where the N-type impurities are doped in high concentration. In order to achieve this configuration, the first impurities are N-type impurities, and the N-type impurities are doped in low concentration so as to form the first source and drain regions 121a of regions where the N-type impurities are doped in low concentration. Furthermore, the second impurities are P-type impurities, and the P-type impurities are doped in high concentration so as to form the second source and drain regions 123a of regions where the P-type impurities are doped in high concentration. In addition, the photoresist pattern 195 covers the second region B, the photoresist pattern 195 is formed so as to cover the first gate electrode 141 and partially cover the first portion 131 of the exposed gate insulating layer around the first gate electrode 141, and third impurities, which are N-type impurities, are implanted in the first semiconductor layer 121 using the photoresist pattern 195 as a mask. The N-type impurities are doped in high concentration so as to form the first source and drain regions 121 having regions where the N-type impurities are doped in low concentration and regions where the N-type impurities are doped in high concentration.

Figure 2F:
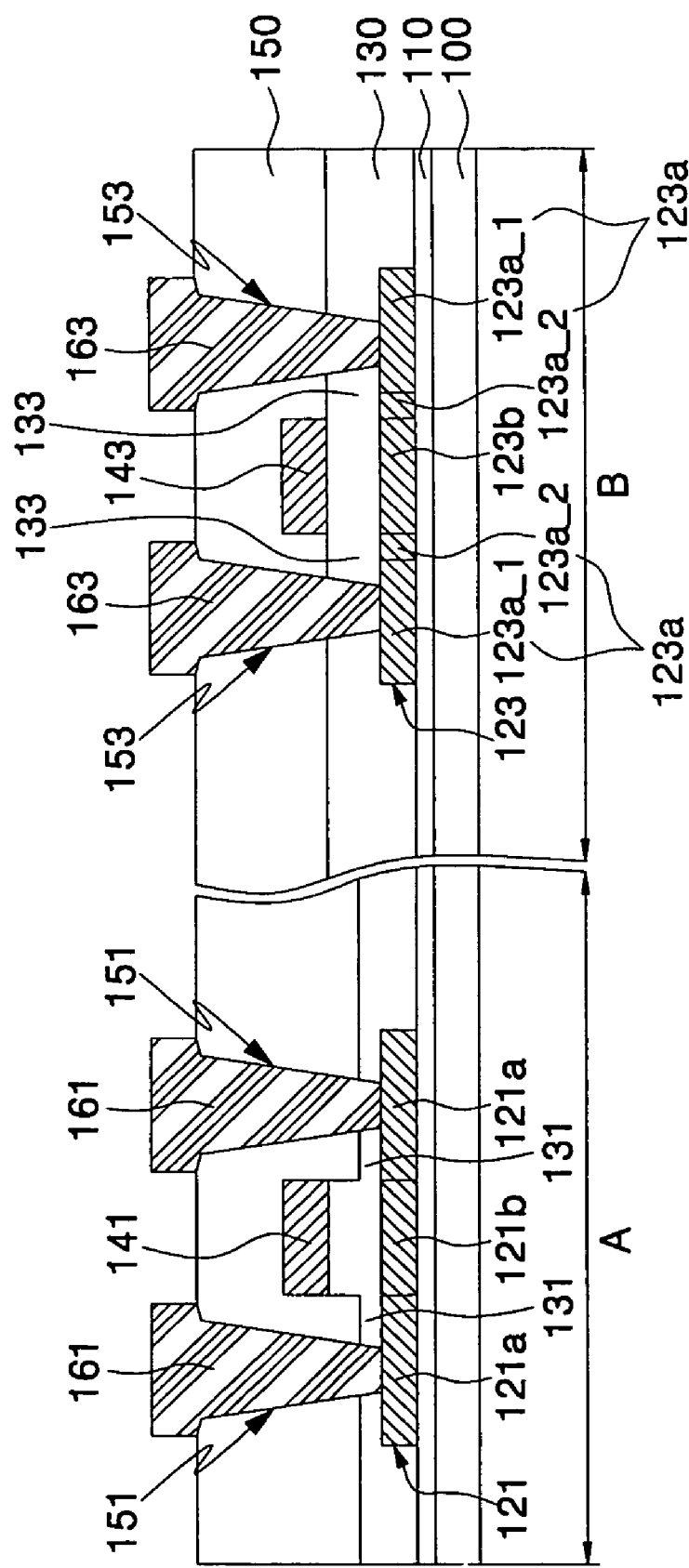

Referring to FIG. 2F, the photoresist pattern 195 is removed so as to expose the gate electrodes 141 and 143. An interlayer-insulating layer 150 is formed on the exposed gate electrodes 141 and 143. Contact holes 151 exposing portions of source and drain regions of the first semiconductor layer 121, and contact holes 153 exposing portions of the source and drain regions of the second semiconductor layer 123, are formed in the interlayer-insulating layer 150 using a fourth pattern mask. First source and drain electrodes 161 and second source and drain electrodes 163, patterned using a fifth pattern mask, are formed on the substrate, at which the contact holes 151 and 153 are formed. The first source and drain electrodes 161 are in contact with the respective exposed portions of the first semiconductor layer 121 through the contact holes 151, and the second source and drain electrodes 163 are in contact with the respective exposed portions of the second semiconductor layer 123 through the contact holes 153.

As a result, a first TFT having the first semiconductor layer 121, the first gate electrode 141, and the first source and drain electrodes 161 is formed in the first region A, and a second TFT having the second semiconductor layer 123, the second gate electrode 143 and the second source and drain electrodes 163 is formed in the second region B. As described above, one of the first and second TFTs is an NMOS TFT, and the other is a PMOS TFT. Therefore, a CMOS TFT is formed.

Referring again to FIG. 2F, the CMOS TFT fabricated by the method as described above will be described.

Referring to FIG. 2F, a substrate 100 includes a first region A and a second region B. A first semiconductor layer 121 and a second semiconductor layer 123 are disposed in the first region A and the second region B, respectively. The first semiconductor layer 121 includes first source and drain regions 121a located at its end portions, and a channel region 121b located between the first source and drain regions 121a. In addition, the second semiconductor layer 123 includes second source and drain regions 123a located at its end portions, and a channel region 123b located between the second source and drain regions 123a. The second source and drain regions 123a include high concentration impurity regions 123a_1 and low concentration impurity regions 123a_2 located at respective sides of the high concentration impurity regions 123a_1.

The first source and drain regions 121a are regions where P-type impurities are doped. In this case, the high concentration impurity regions 123a_1 of the second source and drain regions 123a are regions where N-type impurities are doped in high concentration, and the low concentration impurity regions 123a_2 are regions where N-type impurities are doped in low concentration.

On the other hand, the first source and drain regions 121a may be regions where N-type impurities are doped. In this case, the first source and drain regions 121a may include high concentration impurity regions (not shown) where the N-type impurities are doped in high concentration, and low concentration impurity regions (not shown) located at respective sides of the high concentration impurity regions. In this case, the second source and drain regions 123a are regions where the P-type impurities are doped.

A gate insulating layer 130 is disposed on the semiconductor layers 121 and 123. The gate insulating layer 130 includes a first portion 131 overlying end portions of the first semiconductor layer 121, i.e., the first source and drain regions 121a, and a second portion 133 overlying end portions of the second semiconductor layer 123, i.e., the second source and drain regions 123a, the second portion 133 having a thickness larger than that of the first portion 131. Preferably, a difference in thickness between the first and second portions 131 and 133, respectively, of the gate insulating layer 130 is at least 500 Å. More preferably, the difference in thickness between the first and second portions 131 and 133, respectively, of the gate insulating layer 130 is approximately 500 to 1500 Å. The thickness of the first portion 131 may be not more than 1000 Å, and the thickness of the second portion 133 may be approximately 500 to 1500 Å.

A first gate electrode 141 overlying the channel region 121b of the first semiconductor layer 121 and a second gate electrode 143 overlying the channel region 123b of the second semiconductor layer 123 are located on the gate insulating layer 130. An interlayer-insulating layer 150 covering the gate electrodes 141 and 143 is located on the gate electrodes 141 and 143. First source and drain electrodes 161 in contact with respective end portions of the first semiconductor layer 121, and second source and drain electrodes 163 in contact with respective end portions of the second semiconductor layer 123, passing through the interlayer-insulating layer 150, are formed on the interlayer-insulating layer 150.

In accordance with the present invention as described above, it is possible to reduce the number of masks and to simplify the processes required to manufacture the CMOS TFT.

Although the present invention has been described with reference to certain exemplary embodiments thereof, it will be understood by those skilled in the art that a variety of modifications and variations may be made to the present invention without departing from the spirit or scope of the present invention, as defined in the appended claims and their equivalents.

What is claimed is:

1. A method of fabricating a CMOS thin film transistor (TFT), comprising the steps of:
    providing a substrate having a first region and a second region;
    forming a first semiconductor layer and a second semiconductor layer on the first and second regions, respectively;
    forming a single gate insulating layer having a first portion overlying first source and drain regions of the first semiconductor layer and a second portion overlying second source and drain regions of the second semiconductor layer, wherein the second portion is thicker than the first portion;
    forming an ion doping mask pattern on the gate insulating layer; and
    doping first impurities in the first source and drain regions of the first semiconductor layer using the ion doping mask pattern as a mask, and doping second impurities having a conductivity type different from a conductivity type of the first impurities in the second source and drain regions of the second semiconductor layer using the ion doping mask pattern as a mask.

2. The method of claim 1, wherein a difference in thickness between the first and second portions of the single gate insulating layer is at least 500 Å.

3. The method of claim 2, wherein a difference in thickness between the first and second portions of the single gate insulating layer is in a range of about 500 Å to 1500 Å.

4. The method of claim 1, wherein the first portion of the single gate insulating layer has a thickness of no more than 1000 Å.

5. The method of claim 1, wherein the second portion of the single gate insulating layer has a thickness in a range of about 500 Å to 1500 Å.

6. The method of claim 1, wherein the second impurities are doped at an acceleration voltage higher than an acceleration voltage for doping the first impurities.

7. The method of claim 6, wherein a difference between the acceleration voltage for doping the first impurities and the acceleration voltage for doping the second impurities is in a range of about 30 KeV to 100 KeV.

8. The method of claim 6, wherein the first impurities are doped at an acceleration voltage in a range of about 10 KeV to 80 KeV.

9. The method of claim 6, wherein the second impurities are doped at an acceleration voltage in a range of about 40 KeV to 110 KeV.

10. The method of claim 1, wherein the first impurities are P-type impurities.

11. The method of claim 10, wherein the P-type impurities are doped in a high concentration.

12. The method of claim 10, wherein the second impurities are N-type impurities which are doped in low concentration.

13. The method of claim 1, wherein the first impurities are N-type impurities.

14. The method of claim 13, wherein the N-type impurities are doped in low concentration.

15. The method of claim 13, wherein the second impurities are P-type impurities which are doped in high concentration.

16. The method of claim 1, wherein, after doping the first impurities in the first source and drain regions of the first semiconductor layer, the second impurities are doped in the second source and drain regions of the second semiconductor layer.

17. The method of claim 1, wherein, after doping the second impurities in the second source and drain regions of the second semiconductor layer, the first impurities are doped in the first source and drain regions of the first semiconductor layer.

18. The method of claim 1, wherein the single gate insulating layer and the ion doping mask pattern are formed using a single halftone photo-mask.

19. The method of claim 1, wherein the ion doping mask pattern comprises first and second gate electrodes overlying the first and second semiconductor layers, respectively.

20. The method of claim 19, wherein the step of forming the single gate insulating layer and a step of forming the gate electrodes comprises:
- sequentially forming the single gate insulating layer and a gate conductive layer on the first and second semiconductor layers;
- forming a photoresist layer on the gate conductive layer;
- patterning the photoresist layer using a halftone mask to form a photoresist pattern, the photoresist pattern exposing the gate conductive layer on the first source and drain regions of the first semiconductor layer, the photoresist pattern having thin portions corresponding to the second source and drain regions of the second semiconductor layer and having thick portions corresponding to centers of the semiconductor layers;
- etching the exposed gate conductive layer and the single gate insulating layer under the exposed gate conductive layer using the photoresist pattern as a mask so as to form a first gate electrode and a first portion of the single gate insulating layer;
- etching the thin portions of the photoresist pattern so as to expose the gate is conductive layer on the second source and drain regions of the second semiconductor layer; and
- etching the exposed gate conductive layer using the thick portions of the photoresist pattern as a mask so as to form a second gate electrode.

21. A method of fabricating a CMOS thin film transistor (TFT), comprising the steps of:
- providing a substrate having a first region and a second region;
- forming a first semiconductor layer and a second semiconductor layer on the first and second regions, respectively;
- forming a single gate insulating layer on the semiconductor layers, and providing the gate insulating layer with a first portion overlying first source and drain regions of the first semiconductor layer and a second portion overlying second source and drain regions of the second semiconductor layer, wherein the second portion is thicker than the first portion; and
- disposing a first gate electrode and a second gate electrode on the single gate insulating layer and overlying the first semiconductor layer and the second semiconductor layer, respectively;
- wherein the first portion of the single gate insulating layer has a same thickness in the first source and drain regions of the first semiconductor layer, and the second portion of the single gate insulating layer has a same thickness in the second source and drain regions of the second semiconductor layer.

22. The method of claim 21, wherein a difference in thickness between the first and second portions of the single gate insulating layer is at least 500 Å.

23. The method of claim 22, wherein the difference in thickness between the first and second portions of the single gate insulating layer is in a range of about 500 Å to 1500 Å.

24. The method of claim 21, wherein the first portion of the gate insulating layer has a thickness no greater than 1000 Å.

25. A method of fabricating a CMOS thin film transistor (TFT), comprising the steps of:
- providing a substrate having a first region and a second region;
- forming a first semiconductor layer and a second semiconductor layer on the first and second regions, respectively;
- forming a single gate insulating layer on the semiconductor layers, and providing the gate insulating layer with a first portion overlying first source and drain regions of the first semiconductor layer and a second portion overlying second source and drain regions of the second semiconductor layer, wherein the second portion is thicker than the first portion; and
- disposing a first gate electrode and a second gate electrode on the single gate insulating layer and overlying the first semiconductor layer and the second semiconductor layer, respectively;
- wherein the second source and drain regions of the second semiconductor layer comprise second source and drain regions wherein N-type impurities are doped, and the second source and drain regions comprise a high concentration impurity region and a low concentration impurity region located at one side of the high concentration impurity region.

* * * * *